(12) United States Patent
Jow et al.

(10) Patent No.: US 6,813,138 B1
(45) Date of Patent: Nov. 2, 2004

(54) EMBEDDED MICROELECTRONIC CAPACITOR EQUIPPED WITH GEOMETRICALLY-CENTERED ELECTRODES AND METHOD OF FABRICATION

(75) Inventors: Wei-Ming Jow, Taichung (TW); Pei-Shen Wei, Yunghe (TW); Ching-Liang Weng, Taipei (TW); Chun-Kun Wu, Yun Lin (TW); Chang-Sheng Chen, Taipei (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 10/427,230

(22) Filed: Apr. 30, 2003

(51) Int. Cl.⁷ .......................... H01G 4/228; H01G 4/005
(52) U.S. Cl. ...................... 361/306.1; 361/303; 361/311
(58) Field of Search ........................... 361/301.3, 301.4, 361/306.1, 306.2, 306.3, 307, 303, 304, 305, 311

(56) References Cited

U.S. PATENT DOCUMENTS

| | | | | |
|---|---|---|---|---|
| 6,327,134 B1 | * | 12/2001 | Kuroda et al. | 361/303 |
| 6,430,030 B1 | * | 8/2002 | Farooq et al. | 361/321.2 |
| 6,470,545 B1 | * | 10/2002 | Branchevsky | 29/25.42 |
| 6,477,032 B2 | * | 11/2002 | Makl, Jr. | 361/306.3 |

* cited by examiner

*Primary Examiner*—Dean A. Reichard
*Assistant Examiner*—Eric Thomas
(74) *Attorney, Agent, or Firm*—Shaw Pittman LLP

(57) ABSTRACT

An embedded microelectronic capacitor equipped with geometrically-centered electrodes which includes an upper electrode plate of a first polarity; a middle electrode plate of a second polarity opposite to the first polarity; at least one lower electrode plate of the first polarity in electrical communication with the upper electrode plate through a center via. The center via is positioned at a distance from a geometric center of the middle electrode plate of not larger than 50% of the diameter of the plate, and preferably not larger than 30% of the diameter.

16 Claims, 5 Drawing Sheets

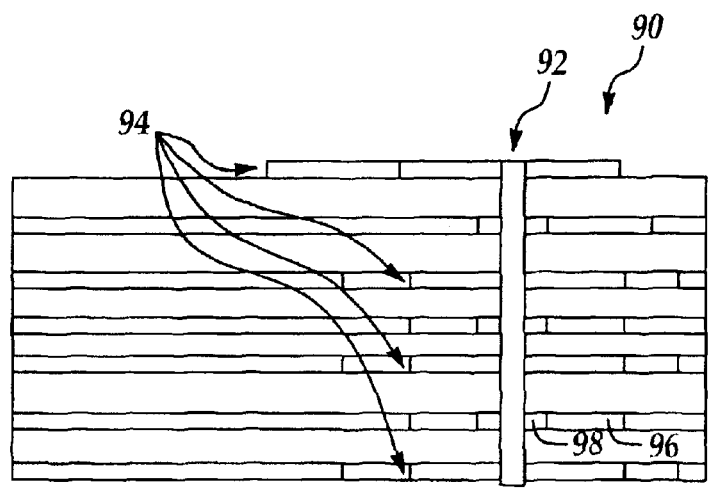
*Figure 5B*
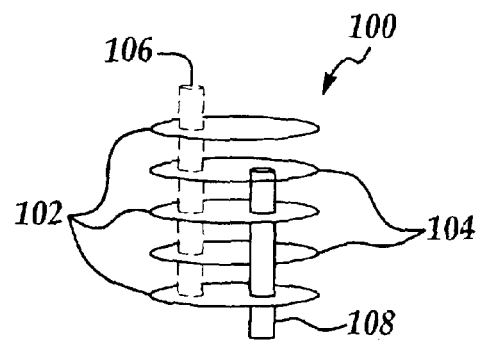
*Figure 6A*
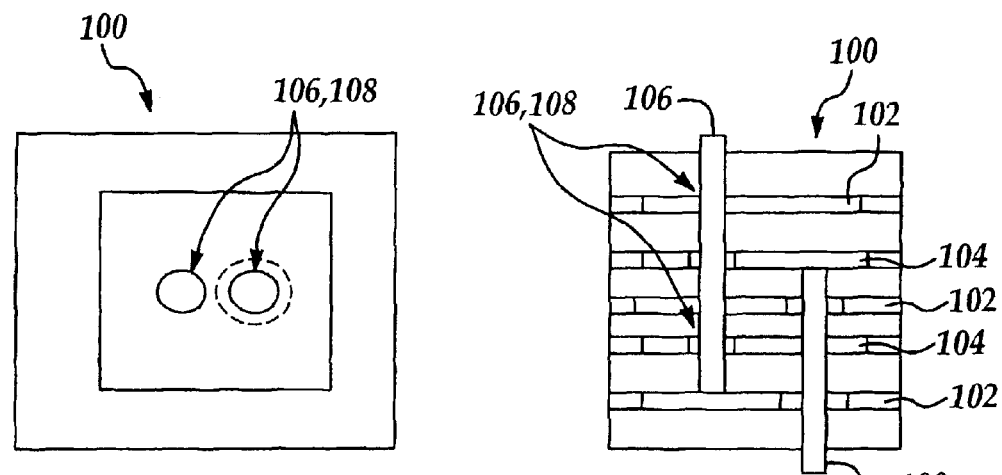
*Figure 6B*  *Figure 6C*

(type 1)    (type 2)

EMBEDDED MICROELECTRONIC CAPACITOR EQUIPPED WITH GEOMETRICALLY-CENTERED ELECTRODES AND METHOD OF FABRICATION

FIELD OF THE INVENTION

The present invention generally relates to an embedded microelectronic capacitor and a method for fabrication and more particularly, relates to an embedded microelectronic capacitor that is equipped with geometrically-centered electrodes and a method for fabricating such capacitor.

BACKGROUND OF THE INVENTION

In the development of modern technology for wireless communication, for digital computing equipment, for portable consumer electronics, the requirements for high frequency, wide band and miniaturization are most critical and must be met. One of the modern trend in such development is centered on the use of embedded components in order to reduce real estate occupied by such circuits. For instance, it is desirable for a circuit designer to replace a most commonly used component of a capacitor in a surface mount technology with an embedded capacitor. This can be achieved by utilizing various structures or materials to fabricate the embedded capacitor. However, when various different fabrication methods are used to embed a capacitor, the connection between the embedded capacitor and other circuit components frequently produces parasitic effects, thus adversely affect the electrical characteristics of the capacitor. The parasitic effect becomes worse as the frequency of the capacitor becomes higher. In the worst case, the capacitor characteristics can be affected to such a stage that it exhibits the characteristics of electrical inductance. The threshold frequency for such transition in characteristics is known as the self-vibration frequency of the component. In modern digital or analog circuits, design of the circuit is more desirably high frequency and wide band. The characteristics of the component that function under high frequency becomes even more important. It is therefore highly desirable to improve the electrode connection method in an embedded capacitor in order to increase its self-vibration frequency for use in high frequency circuit applications.

Conventionally, as shown in U.S. Pat. No. 6,191,934 entitled "High Dielectric Constant Embedded Capacitors", the connection method for the embedded capacitor is by edge connection. For instance, as shown in FIG. 1 of the patent, each electrode plate 14 is connected on the edge by a trace 16 wherein the terminal of the trace 16 is formed in a connecting pad 12. A series of connecting pads 12 are then electrically connected together by a lead 18 providing electrical connection for the embedded capacitor 10 to outside circuit components.

A disadvantage of the edge connection shown in FIG. 1 for the embedded capacitor 10 is that not only circuit real estate is increased due to the area occupied by trace 16 and by the connecting pads 12, the edge connection also produces unavoidable and difficult-to-analyze effective parasitic elements. As a result, the high frequency electrical characteristics of the embedded capacitor are severely affected to decrease the self-vibration frequency and to thus make such connection method inadequate in high frequency circuits.

In another conventional method for connecting embedded capacitors, as shown in U.S. Pat. No. 5,400,210 entitled "Substrate Having a Built-In Capacitor and Process for Producing the Same", through via 22 is utilized in an embedded capacitor 20 for connecting to the positive and negative electrode plates. The point of connection is far away from the geometric center of the electrode plate and thus causing unbalanced high frequency effective circuit due to the variation in the distances between the connection point and the edges of the electrode plates. Such unbalanced high frequency effective circuit further deteriorates the high frequency electrical characteristics of the embedded capacitor such as its self-vibration frequency.

It is therefore an object of the present invention to provide a method for connecting an embedded capacitor without the drawbacks or shortcomings of the conventional connection methods for such embedded capacitors.

It is another object of the present invention to provide a connection method for embedded capacitors such that its self-vibration frequency can be improved.

It is a further object of the present invention to provide a connection method for embedded capacitors such that the capacitor can be utilized in high frequency circuits.

It is still another object of the present invention to provide a connection method for embedded capacitors such that the connection point is within 50% of the diameter of the electrode plate from its geometric center.

SUMMARY OF THE INVENTION

In accordance with the present invention, an embedded microelectronic capacitor equipped with geometrically-centered electrodes and a method for fabricating such capacitor are provided.

In a preferred embodiment, an embedded microelectronic capacitor is provided which includes an upper electrode plate of a first polarity; a middle electrode plate of a second polarity opposite the first polarity of the upper electrode plate and having a center aperture therethrough; at least one lower electrode plate of the first polarity in electrical communication with the upper electrode plate through a center via positioned through the center aperture of the middle electrode plate without shorting to the middle electrode plate, the center via is positioned at a distance from a geometric center of the middle electrode plate not larger than 50% of a diameter of the at least one lower electrode plate; and a first electrical lead connected to an edge portion of the upper electrode plate wherein the upper electrode plate, the middle electrode plate and the at least one lower electrode plate are embedded parallel to each other in at least one dielectric material forming at least a single-port capacitor.

The embedded microelectronic capacitor may further include a second electrical lead connected to an edge portion of the middle electrode forming a dual-port capacitor. The middle electrode may be grounded forming a single-port capacitor. The upper electrode plate, the middle electrode plate and the at least one lower electrode plate are fabricated of an electrically conductive metal. The upper electrode plate, the middle electrode plate and the at least one lower electrode plate may be fabricated of Cu or Al. The center via, the first electrical lead and the second electrical lead may be formed of a low electrical resistance metal, or may be formed of tungsten. The upper electrode plate, the middle electrode plate and the at least one lower electrode plate each has a thickness between about 0.01 mm and about 0.1 mm. The upper electrode plate, the middle electrode plate and the at least one lower electrode plate are embedded parallel to each other at a distance between about 0.05 mm and about 0.5 mm.

The present invention is further directed to an embedded microelectronic capacitor which includes a first electrode plate that has a first via mounted perpendicularly therethrough making electrical connection and an oppositely positioned first aperture in the plate adapted for receiving a second via without making electrical connection; at least one second electrode plate that has a second aperture therethrough adapted for receiving the first via without making electrical connection and a second via mounted perpendicularly therethrough making electrical connection with the at least one second electrode plate but not with the first electrode plate, the at least one second electrode plate is substantially parallel to the first electrode plate; the at least one third electrode plate that has the first via mounted perpendicularly therethrough making electrical connection and an oppositely positioned third aperture adapted for receiving the second via without making electrical contact, the at least one third electrode plate is substantially parallel to the second electrode plate; and a dielectric material filling a gap formed in between the first electrode plate, the at least one second electrode plate and the at least one third electrode plate.

In the embedded microelectronic capacitor, the first via is mounted through the first electrode plate off-centered in the first electrode plate. The second via is mounted through the second electrode plate off-centered in the second electrode plate. The first electrode plate, the at least one second electrode plate and the at least one third electrode plate are fabricated of an electrically conductive metal, or fabricated of Cu or Al. The first via and the second via may be formed of a low electrical resistance metal, or may be formed of tungsten. The first electrode plate, the at least one second electrode plate and the at least one third electrode plate each has a thickness between about 0.01 mm and about 0.1 mm. The first electrode plate, the at least one second electrode plate and the at least one third electrode plate are embedded parallel to each other at a distance between 0.05 mm and about 0.5 mm.

BRIEF DESCRIPTION OF THE DRAWINGS

These and other objects, features and advantages of the present invention will become apparent from the following detailed description and the appended drawings in which:

FIGS. 5A and 5B are enlarged, cross-sectional views of the present invention single-port, multi-layer embedded capacitor.

FIGS. 6A, 6B and 6C are a perspective view, a plane view and an enlarged, cross-sectional view of a present invention dual-port, multi-layer embedded capacitor, respectively.

DETAILED DESCRIPTION OF THE PREFERRED AND ALTERNATE EMBODIMENTS

An embedded microelectronic capacitor constructed by an upper electrode plate, a middle electrode plate and at least one lower electrode plate embedded in a dielectric material is disclosed. A first electrical lead is connected to an edge portion of the upper electrode plate to form at least a single-port capacitor.

In a preferred embodiment, the upper electrode plate is connected to a first polarity, the middle electrode plate is connected to a second polarity that is opposite to the first polarity and has a center aperture therethrough. The at least one lower electrode plate is also connected to the first polarity by making electrical communication with the upper electrode plate through a center via positioned through the center aperture of the middle electrode plate without shorting to the middle electrode plate. The center via is positioned at a distance from a geometric center of the middle electrode plate of not larger than 50% of a diameter of the plate.

Referring initially to FIGS. 2A–2D wherein various embodiments of the present invention embedded capacitor are shown. The present invention embedded capacitor structure can be best connected by using either blind holes or buried holes from an upper end or a lower end of the electrode plate. A three dimensional embedded capacitor is thus formed. It is discovered that the electrical lead or via when connected through either a blind hole or a buried hole should be located at the geometrical center of the electrode plate. Such location enables the embedded capacitor to obtain the best high frequency electrical characteristics. Furthermore, by connecting through a via located at the geometrical center of the electrode plate, it further simplifies the connection of the capacitor with surrounding elements and furthermore, improves the electrical characteristics of the embedded capacitor. The parasitic inductance or capacitance and its coupling effect due to the connection method may be significantly reduced.

Figure 1:
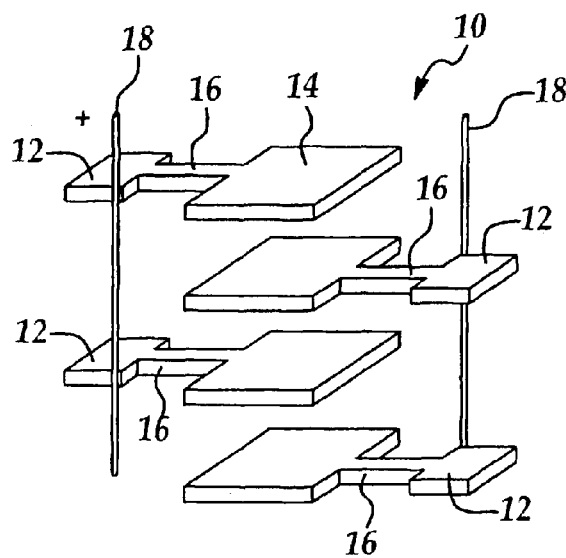
FIG. 1 is a perspective view of a conventional edge connection method for embedded capacitor.
Figure 2A:
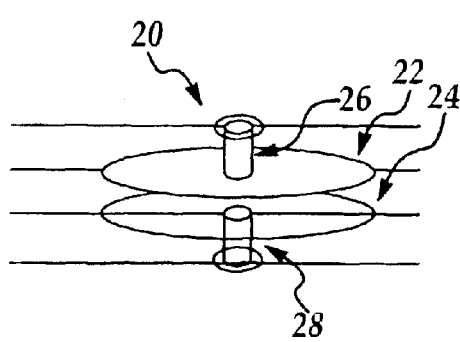
FIGS. 2A–2D are perspective views of various configurations for the present invention embedded capacitor that is equipped with geometrically-centered electrodes.
Figure 2B:
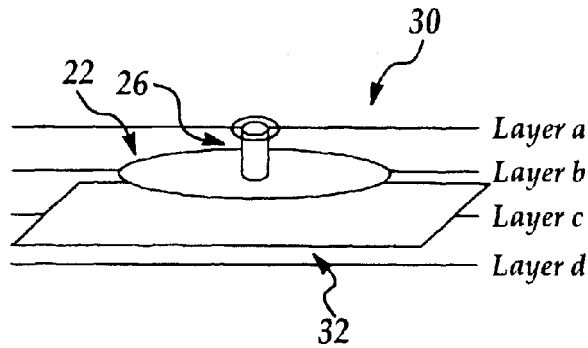
Figure 2C:
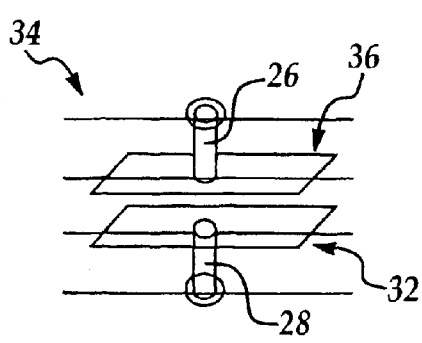
Figure 2D:
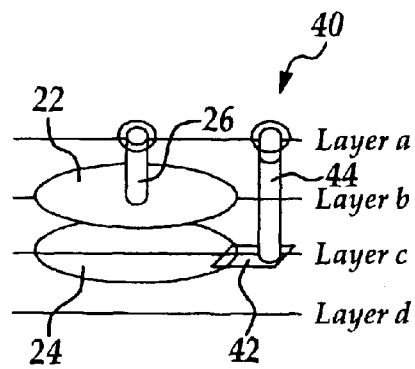

FIG. 2A is a perspective view of a present invention embedded capacitor 20 having an upper electrode plate 22, a lower electrode plate 24, each connected to an upper via 26 and a lower via 28, respectively. Layers a, b, c and d indicate various layers of dielectric, insulating material that embeds the embedded capacitor 20. A second embodiment of the present invention embedded capacitor 30 is shown in FIG. 2B. An upper electrode plate 22 is similar to that shown in FIG. 2A, while a lower electrode plate 32 is a ground plane or a ground electrode. Similarly, FIG. 2C illustrates an embedded capacitor 34 having an upper ground electrode 36 and a lower ground electrode 38, each connected to an upper via 26, a lower via 28, respectively. A fourth embodiment of the present invention embedded capacitor 40 is shown in FIG. 2D, wherein an upper electrode plate 22, a lower electrode plate 24 are each connected by a center via 26 and a lower edge connection 42 and a via 44, respectively.

Figure 3:
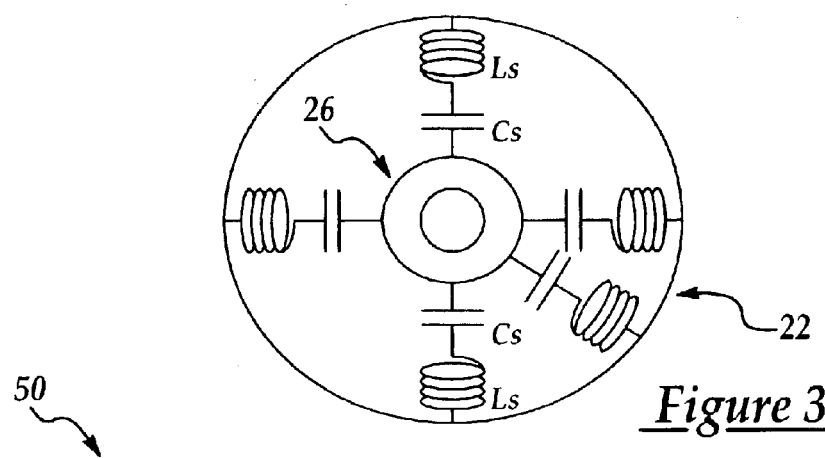
FIG. 3 is an illustration of an equivalent circuit of the present invention embedded capacitor.

An equivalent circuit illustrating the present invention various embodiments shown in FIGS. 2A–2D is shown in FIG. 3. The capacitance Cs and the inductance Ls are shown for the circuit.

As shown in FIG. 3, when the connection method for the embedded capacitor is from the geometric center of the electrode plate, the distance between the edge of the electrode plate and the center of the electrode plate are equal in the case of a circular electrode plate. It is thus shown, in FIG. 3, for a high frequency equivalent circuit, any circuit originating from the center point to the edge of the electrode plate has the same equivalent capacitance and inductance connected in series, and thus the equivalent circuit is balanced over the circular electrode plate. This further proves that the best high frequency electrical characteristics for an embedded capacitor can be achieved by connecting to a geometric center of the electrode plate. It has been determined in the present invention preferred embodiment that when the connection is within 50% of the diameter of the electrode plate measured from the center of the electrode plate, and preferably within 30% of the diameter of the electrode plate, the electrical characteristics of the embedded capacitor can be greatly improved.

Figure 4A:
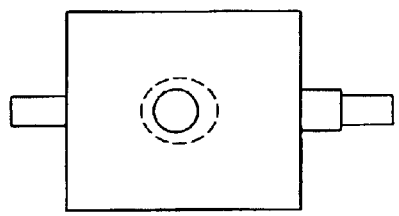
FIGS. 4A and 4B are a plane view and an enlarged, cross-sectional view of a present invention single-port, dual-layer embedded capacitor.
Figure 4B:
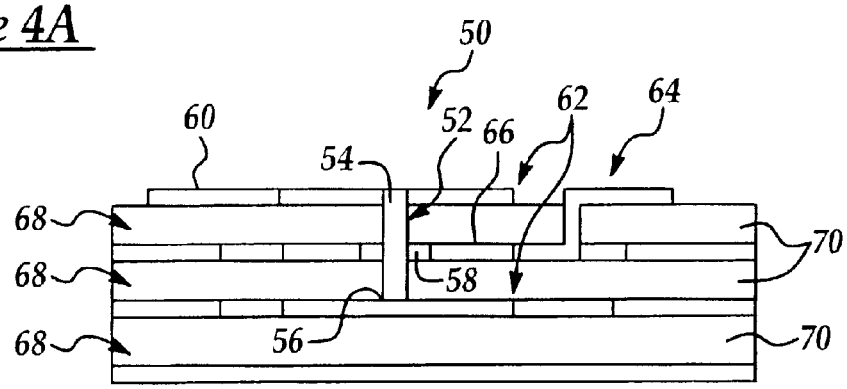

FIGS. 4A and 4B illustrate a plane view and an enlarged, cross-sectional view of an embedded dual-layer, single-port plate capacitor 50. A center via 52 is used to connect blind holes 54,56 through buried hole 58 without making electrical contact. The electrical connection to the embedded capacitor 50 can be achieved by an upper electrical lead 60 connecting to the edge portion of the upper electrode 62 and a second electrical lead 64 connecting to the center electrode plate 66 without electrically contacting the center via 52. The ground planes are shown as 68. A three dimensional embedded capacitor 50 is thus formed. The second electrical lead 64 enables the formation of a dual-port capacitor. Alternatively, the center electrode plate 66 may be grounded without the second electrical lead 64 to form a single-port capacitor. Various dielectric material layers 70 may be used for embedding the capacitor 50.

Figure 5A:
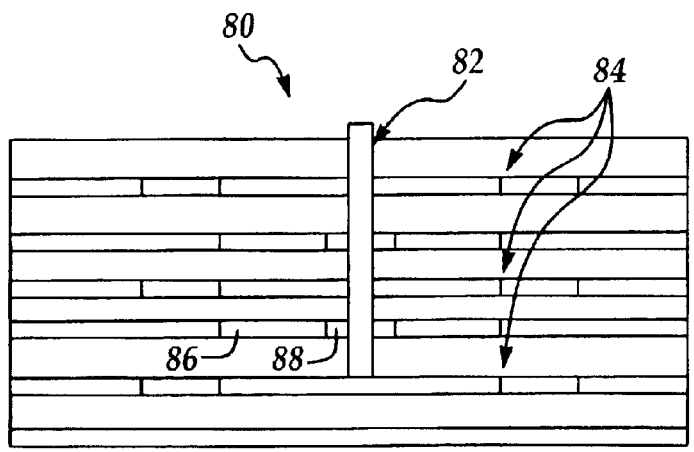

FIGS. 5A and 5B illustrate another embodiment for the present invention multi-layer, single-port capacitor 80 and 90. Center vias 82 and 92 may be suitably formed of a low electrical resistance material, such as tungsten. The upper electrode plate 84,94 may be suitably formed of a high electrical conductivity material, such as Cu or Al. The middle electrode plate 86,96 each have an aperture 88,98 therethrough for accommodating the center via 82,92 without making electrical contact. Various dielectric materials such as silicon oxide, silicon nitride, silicon oxynitride or polymeric-based dielectric materials may be used for filling the gaps in-between the electrode plates.

Still another preferred embodiment of the present invention, a dual-port, multi-layer embedded capacitor 100 is shown in FIGS. 6A, 6B and 6C in a perspective view, plane view and an enlarged, cross-sectional view, respectively. In the embedded capacitor 100, two vias, i.e. and thus two ports, 106,108 are used each for connecting electrodes 102 and 104, respectively. The electrode plates 102,104 are intermittently arranged such that both the via 106 and the via 108 are positioned off-centered in relation to the electrode plates 102,104.

Figure 7A:
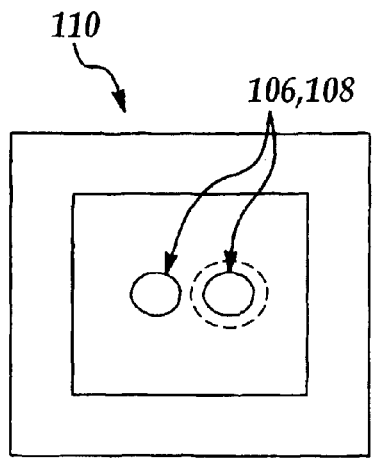
FIGS. 7A and 7B are a plane view and an enlarged, cross-sectional view of a present invention dual-port, multi-layer embedded capacitor.
Figure 7B:
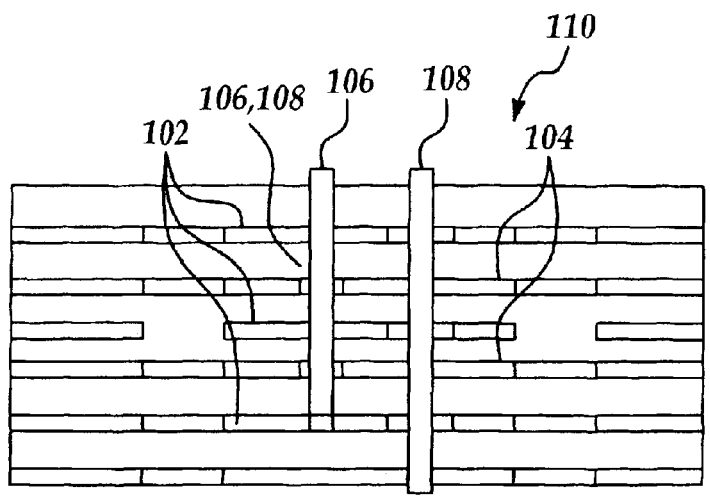

Still another alternate embodiment of the present invention dual-port, multi-layer embedded plate capacitor 110 is shown in FIGS. 7A and 7B in a plane view and a cross-sectional view, respectively.

Figure 8A:
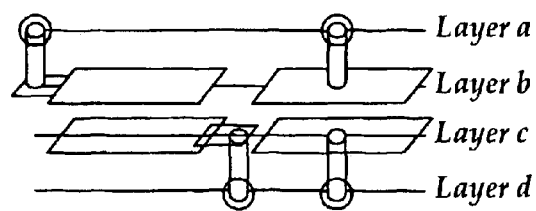
FIGS. 8A and 8B are illustrations of the present invention embedded capacitor and its improvement over a conventional embedded capacitor.
Figure 8B:
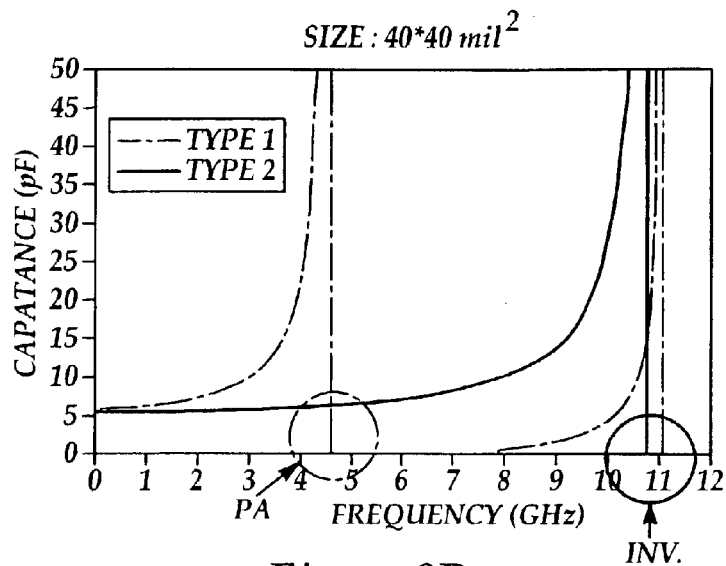
Figure 9A:
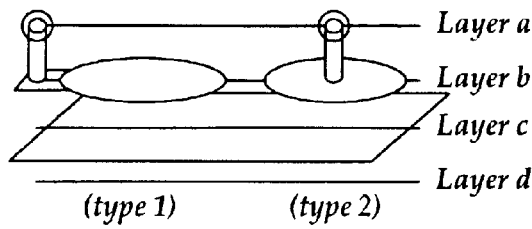
FIGS. 9a and 9B are illustrations of an alternate embodiment of the present invention embedded capacitor and its improvement over the conventional embedded capacitor.
Figure 9B:
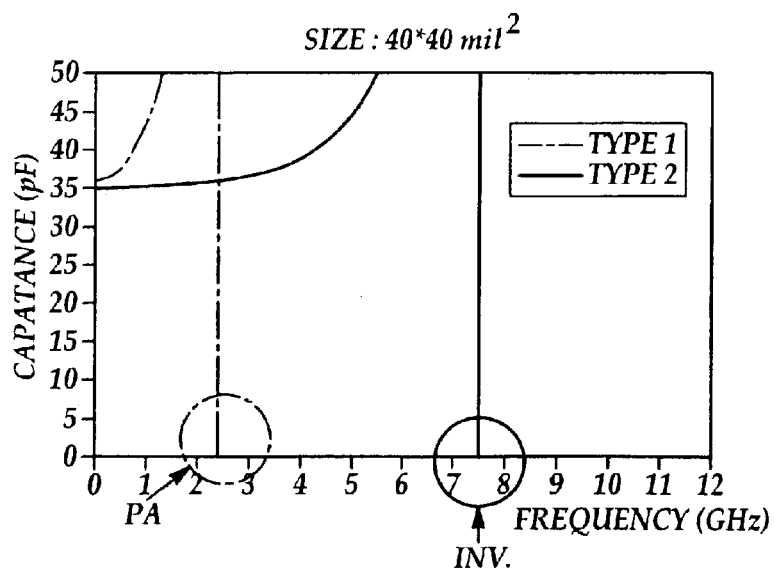

The effectiveness of the present invention novel embedded capacitors is shown in FIGS. 8A–8B and 9A–9B. In each of the figures, Type II indicates the present invention embedded capacitor that utilizes centrally located (or geometrically-centered) vias for connecting electrically the electrode plates. As shown by FIGS. 8B and 9B, the self-vibration frequency of the embedded capacitor that has center connection is significantly improved, i.e. by more than 100% from that of the conventional embedded capacitors that have edge connections.

The present invention novel embedded capacitor equipped with geometrically-centered electrodes have therefore been amply described in the above descriptions and in the appended drawings of FIGS. 2A–9B.

While the present invention has been described in an illustrative manner, it should be understood that the terminology used is intended to be in a nature of words of description rather than of limitation.

Furthermore, while the present invention has been described in terms of one preferred and various alternate embodiments, it is to be appreciated that those skilled in the art will readily apply these teachings to other possible variations of the inventions.

The embodiment of the invention in which an exclusive property or privilege is claimed are defined as follows.

What is claimed is:

1. An embedded microelectronic capacitor comprising:
   an upper electrode plate of a first polarity;
   a middle electrode plate of a second polarity opposite to said first polarity of said upper electrode plate having an aperture therethrough;
   at least one lower electrode plate of said first polarity in electrical communication with said upper electrode plate through a via positioned through said center aperture of said middle electrode plate without shorting to said middle electrode plate, said via being positioned at a distance from a geometric center of said middle electrode plate of not larger than 50% of a diameter of said middle electrode plate; and
   a first electrical lead connected to an edge portion of said upper electrode plate wherein said upper electrode plate, said middle electrode plate and said at least one lower electrode plate are embedded parallel to each other in at least one dielectric material forming at least a single-port capacitor.

2. An embedded microelectronic capacitor according to claim 1 further comprising a second electrical lead connected to an edge portion of said middle electrode forming a dual-port capacitor.

3. An embedded microelectronic capacitor according to claim 1, wherein said middle electrode is grounded forming a single-port capacitor.

4. An embedded microelectronic capacitor according to claim 1, wherein said upper electrode plate, said middle electrode plate and said at least one lower electrode plate are fabricated of an electrically conductive metal.

5. An embedded microelectronic capacitor according to claim 1, wherein said upper electrode plate, said middle electrode plate and said at least one lower electrode plate are fabricated of Cu or Al.

6. An embedded microelectronic capacitor according to claim 1, wherein said via, said first electrical lead and said second electrical lead are formed of a low electrical resistance metal.

7. An embedded microelectronic capacitor according to claim 1, wherein said upper electrode plate, said middle electrode plate and said at least one lower electrode plate each having a thickness between about 0.01 mm and about 0.1 mm.

8. An embedded microelectronic capacitor according to claim 1, wherein said upper electrode plate, said middle electrode plate and said lower electrode plate are embedded parallel to each other at a distance between about 0.05 mm and about 0.5 mm.

9. An embedded microelectronic capacitor comprising:

a first electrode plate having a first via mounted perpendicularly therethrough making electrical connection and an oppositely positioned first aperture in said plate adapted for receiving a second via without making electrical connection, wherein said first via being mounted to said first electrode plate at a distance to a center of said first electrode plate within 30% of the diameter of said first electrode plate;

at least one second electrode plate having a second aperture therethrough adapted for receiving said first via without making electrical connection and a second via mounted perpendicularly therethrough making electrical connection with said at least one second electrode plate but not with said first electrode plate, said at least one second electrode plate being substantially parallel to said first electrode plate;

at least one third electrode plate having said first via mounted perpendicularly therethrough making electrical connection and an oppositely positioned third aperture adapted for receiving said second via without making electrical contact, said at least one third electrode plate being substantially parallel to said second electrode plate, wherein said first via being mounted to said at least one third electrode plate at a distance to a center of said third electrode plate, within 30% of the diameter of said third electrode plate; and a dielectric material filling a gap formed in between said first electrode plate, said at least one second electrode plate and said at least one third electrode plate.

10. An embedded microelectronic capacitor according to claim 9, wherein said first via is mounted through said first electrode plate off-centered in said first electrode plate.

11. An embedded microelectronic capacitor according to claim 9, wherein said second via is mounted through said second electrode plate off-centered in said second electrode plate.

12. An embedded microelectronic capacitor according to claim 9, wherein said first electrode plate, said at least one second electrode plate and said at least one third electrode plate are fabricated of an electrically conductive metal.

13. An embedded microelectronic capacitor according to claim 9, wherein said first electrode plate, said at least one second electrode plate and said at least one third electrode plate are fabricated of Cu or Al.

14. An embedded microelectronic capacitor according to claim 9, wherein said first via and said second via are formed of a low electrical resistance metal.

15. An embedded microelectronic capacitor according to claim 9, wherein each electrode plate having a thickness between about 0.01 mm and about 0.1 mm.

16. An embedded microelectronic capacitor according to claim 9, wherein said first electrode plate, said at least one second electrode plate and said at least one third electrode plate each having a thickness between about 0.01 mm and about 0.1 mm are embedded parallel to each other at a distance between about 0.05 mm and about 0.5 mm.

* * * * *

UNITED STATES PATENT AND TRADEMARK OFFICE
CERTIFICATE OF CORRECTION

PATENT NO.    : 6,813,138 B1
DATED         : November 2, 2004
INVENTOR(S)   : Wei-Ming Jow et al.

It is certified that error appears in the above-identified patent and that said Letters Patent is hereby corrected as shown below:

<u>Title page,</u>
Item [75], Inventor, the first inventor's name should read -- Uei-Ming Jow --.

Signed and Sealed this

Eleventh Day of October , 2005

JON W. DUDAS
*Director of the United States Patent and Trademark Office*